United States Patent
Kräuter

(10) Patent No.: US 9,121,585 B2
(45) Date of Patent: Sep. 1, 2015

(54) OPTOELECTRONIC COMPONENT AND METHOD FOR THE PRODUCTION THEREOF

(75) Inventor: Gertrud Kräuter, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 254 days.

(21) Appl. No.: 13/634,692

(22) PCT Filed: Mar. 7, 2011

(86) PCT No.: PCT/EP2011/053385
§ 371 (c)(1),
(2), (4) Date: Oct. 23, 2012

(87) PCT Pub. No.: WO2011/113721
PCT Pub. Date: Sep. 22, 2011

(65) Prior Publication Data
US 2013/0155696 A1    Jun. 20, 2013

(30) Foreign Application Priority Data

Mar. 15, 2010    (DE) .......... 10 2010 011 428

(51) Int. Cl.
*F21S 4/00* (2006.01)
*F21V 21/00* (2006.01)
*F21V 15/06* (2006.01)
*H01L 23/06* (2006.01)
*H01L 33/56* (2010.01)
(Continued)

(52) U.S. Cl.
CPC ................ *F21V 15/06* (2013.01); *F21V 29/15* (2015.01); *H01L 23/06* (2013.01); *H01L 33/56* (2013.01); *H01L 33/486* (2013.01); *H01L 2224/48091* (2013.01); *H01L 2933/0033* (2013.01); *Y10T 29/49002* (2015.01)

(58) Field of Classification Search
CPC ......... H01L 23/06; H01L 33/56; F21V 15/06; F21V 29/15
USPC .......... 362/800, 249.02, 311.02; 257/E33.06, 257/E33.059, 98–103; 359/359, 360
See application file for complete search history.

(56) References Cited

U.S. PATENT DOCUMENTS

2006/0052537 A1    3/2006 Kanno et al.
2008/0054287 A1*   3/2008 Oshio et al. ............. 257/99
(Continued)

FOREIGN PATENT DOCUMENTS

CN    1703448    11/2005
CN    1781989    6/2006
(Continued)

OTHER PUBLICATIONS

LANXESS Deutschland GmbH, "Pocan B 7375 000000" *Energizing Chemistry*, Ausgabe, May 4, 2009, 3 sheets.
(Continued)

*Primary Examiner* — Jason Moon Han
(74) *Attorney, Agent, or Firm* — DLA Piper LLP (US)

(57) ABSTRACT

An optoelectronic component includes a housing which includes a first partial region having a first thermoplastic material crosslinked by irradiation and a second partial region having a second thermoplastic material, a recess in the housing, and a radiation-emitting device disposed in the recess.

10 Claims, 1 Drawing Sheet

(51) Int. Cl.
*F21V 29/15* (2015.01)
*H01L 33/48* (2010.01)

(56) References Cited

U.S. PATENT DOCUMENTS

2008/0135525 A1    6/2008  Claeys et al.
2008/0224159 A1*   9/2008  Krauter et al. .................. 257/98
2009/0173957 A1    7/2009  Brunner et al.
2009/0268279 A1*  10/2009  Higuchi ........................ 359/360

FOREIGN PATENT DOCUMENTS

| | | |
|---|---|---|
| CN | 101278213 | 10/2008 |
| DE | 10 2005 061828 | 1/2007 |
| DE | 603 12 198 T2 | 11/2007 |
| DE | 11 2006 002 540 T5 | 8/2008 |
| EP | 0 663 679 | 7/1995 |
| EP | 1 923 897 | 5/2008 |
| JP | 2005-159045 | 6/2005 |
| JP | 2006-269667 | 10/2006 |
| JP | 2009-88335 | 4/2009 |
| JP | 2010-505254 | 2/2010 |
| JP | 2010-153666 | 7/2010 |
| WO | 2006/114082 | 11/2006 |

OTHER PUBLICATIONS

BGS Beta-Gamma-Service GmbH & Co. KG, "BGS Anwendungsbericht > Polybutylenterephthalat—PBT", *Ideen Plus Energie*, undated datasheet, abstract and English translation, 4 sheets.
BGS Beta-Gama-Service GmbH & Co.. KG, "BGS Anwendungsbericht Polyamid PA," *Ideen Plus Energie*, undated datasheet, abstract and English translation, 3 sheets.
"TAIC / Triallyl Isocyanurate," undated datasheet, 9 sheets.
Chinese Examination Report dated Aug. 8, 2014 from corresponding Chinese Patent Application No. P2010.0632.
English translation of corresponding Notice of Reasons for Rejection dated Jan. 27, 2015 of Japanese Application No. 2012-557480.

* cited by examiner

OPTOELECTRONIC COMPONENT AND METHOD FOR THE PRODUCTION THEREOF

RELATED APPLICATIONS

This is a §371 of International Application No. PCT/EP2011/053385, with an international filing date of Mar. 7, 2011, which is based on German Patent Application No. 10 2010 011 428.6, filed on Mar. 15, 2010, the subject matter of which is incorporated by reference.

TECHNICAL FIELD

This disclosure relates to an optoelectronic component and a method of producing the optoelectronic component.

BACKGROUND

A very widespread problem of optoelectronic components is adapting their individual parts to different requirements. It could therefore be helpful to provide an optoelectronic component which comprises a housing adapted to different requirements.

SUMMARY

I provide an optoelectronic component including a housing which includes a first partial region having a first thermoplastic material crosslinked by irradiation and a second partial region having a second thermoplastic material, a recess in the housing, and a radiation-emitting device disposed in the recess.

I also provide a method of producing the optoelectronic component, including A) forming the first partial region of the housing from a material which includes the first thermoplastic material, B) forming the second partial region of the housing from a material which includes the second thermoplastic material, C) irradiating the first partial region so that the first thermoplastic material is crosslinked, and D) introducing the radiation-emitting device into a recess of the housing.

I further provide an optoelectronic component including a housing which includes a first partial region having a first thermoplastic material and a second partial region having a second thermoplastic material, wherein the first partial region is formed as a housing base body; a recess in the housing, and a radiation-emitting device disposed in the recess, wherein 1) the first thermoplastic material is at least one selected from the group consisting of polyetherimide, polysulfone and PEEK and has been crosslinked by irradiation, 2) the second thermoplastic material is at least one selected from the group consisting of polyamide, polybutylene terephthalate, polyethylene terephthalate, polyester, polyester copolymers and fluorinated polymers, and 3) the second thermoplastic material has a higher degree of reflectivity with respect to the radiation emitted by the radiation-emitting device, than the first thermoplastic material.

DETAILED DESCRIPTION

Figure 1:
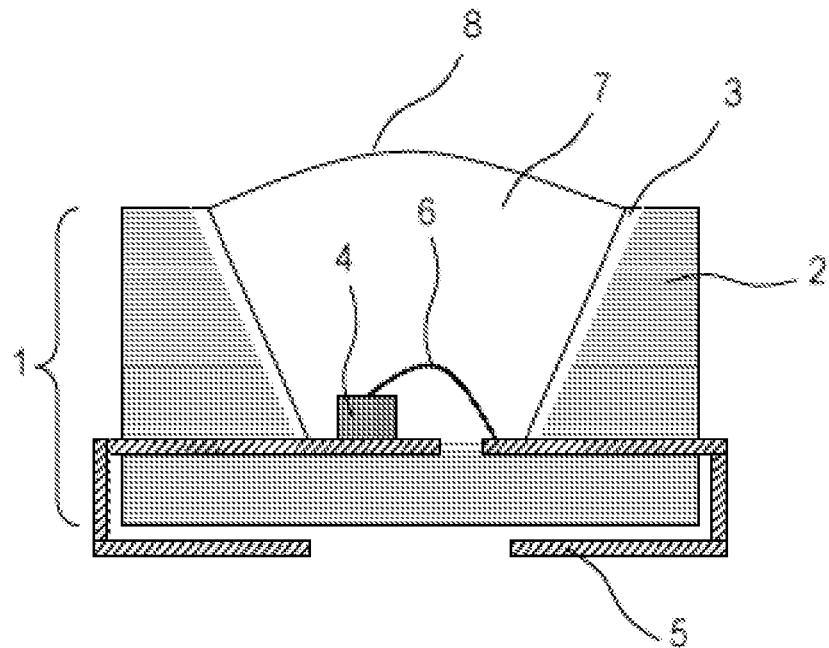
FIG. 1 shows a schematic cross section of a first example of an optoelectronic component.

I provide an optoelectronic component comprising a housing which may comprise a first partial region having a first thermoplastic material and a second partial region having a second thermoplastic material, a recess in the housing, a radiation-emitting device disposed in the recess, wherein the first thermoplastic material has been crosslinked by irradiation.

By virtue of the fact that the optoelectronic component comprises a housing which comprises at least two different partial regions, each of which comprises a thermoplastic material, it is possible to tailor the physical and chemical properties of the first partial region and the second partial region in each case to suit their requirements and functions in the housing.

Because of the crosslinking of the first thermoplastic material which by nature does not have any crosslinking, it acquires an increased level of stability. This increased level of stability can be both chemical and physical in nature. The first partial region which comprises the first thermoplastic material thus has a higher resistance e.g. to destruction, deformation or discoloration e.g. through the influence of heat, irradiation or even mechanical action.

The first thermoplastic material may differ from the second thermoplastic material.

By virtue of the fact that the first thermoplastic material differs from the second thermoplastic material, it is possible to adapt the first partial region or the second partial region of the housing separately in a specific manner to their respective requirements. In this case, e.g. the partial region subjected to the radiation of the radiation-emitting device can have a particularly high resistance to the radiation or can have e.g. a particularly high reflectivity in relation to the radiation. In contrast, the other partial region can have e.g. an increased level of thermal stability which can mean that the optoelectronic component can be attached to another device e.g. by soldering.

The first thermoplastic material may have a higher level of thermal stability than the second thermoplastic material.

This then proves to be particularly advantageous if the first partial region, which comprises the first thermoplastic material, is subjected to high thermal requirements. The first partial region can be subjected to a higher thermal loading e.g. during the manufacturing process of the optoelectronic component, as well as in subsequent assembly steps which follow on from the manufacturing steps of the optoelectronic component. Preferably, the partial regions of the housing, subjected to increased thermal requirements comprise the first thermoplastic material.

After crosslinking, the first thermoplastic material may have stability up to a temperature of at least 275° C.

This means inter alia that the thermoplastic material can be subjected to this temperature without the thermoplastic material being discolored or deformed. By virtue of the fact that the thermoplastic material has thermal stability up to 275° C., it is possible to perform e.g. soldering processes on the first partial region which comprises the first thermoplastic material, the soldering processes operating at a temperature of up to 275° C. Preferably, after crosslinking, the first thermoplastic material has stability up to a temperature of at least 300° C.

The first partial region may be formed as a housing base body.

The term "housing base body" is to be understood to be the particular partial region of the housing which constitutes inter alia the base of the housing. Furthermore, the housing base body can also form a frame which has a recess in which the radiation-emitting device is disposed. The housing base body constitutes inter alia the particular part of the housing which can be connected to a lead frame.

The first thermoplastic material may have a crosslinking additive.

The crosslinking additive promotes crosslinking of the thermoplastic material which is effected by irradiation. In this case, it can be a crosslinking additive which influences e.g. the rate of crosslinking or even the degree of crosslinking. However, in this case it can also be a crosslinking additive which actually only permits crosslinking in combination with the corresponding thermoplastic material. In this case, the crosslinking additive is tailored to the first thermoplastic material so that the desired extent of crosslinking is achieved by the specified irradiation and, therefore, the desired physical and chemical properties are achieved in the thermoplastic material.

The crosslinking additive may be selected from: triallyl isocyanate, trimethylolpropane triacrylate and pentaerythriol triacrylate.

In tests, these crosslinking additives have proven to be particularly advantageous.

The second partial region may be disposed on the first partial region.

In this case, examples, in which the second partial region is disposed directly on the first partial region, are feasible as are examples in which a further third partial region is disposed between the second partial region and the first partial region. However, in each case there is a clear separation between the first partial region and the second partial region. Therefore, a partial region cannot appertain simultaneously to the first partial region and the second partial region.

The first partial region may be formed from the first thermoplastic material.

The second partial region may be formed from the second thermoplastic material.

By virtue of the fact that the first partial region and the second partial region are formed from the first thermoplastic material and the second thermoplastic material, respectively, the respective thermoplastic materials definitively determine the physical and chemical properties of the respective partial regions.

The second partial region may be formed as a reflector.

In this case, the second thermoplastic material preferably has an increased resistance to the radiation which is emitted by the radiation-emitting device which is disposed in the reflector. In this case, the resistance of the second thermoplastic material is tailored to the wavelength of the emitted radiation. Therefore, if radiation which also has a UV-component is emitted e.g. by the radiation-emitting device, the second thermoplastic material and the degree of crosslinking thereof are selected such that the second thermoplastic material or the reflector, which comprises this second thermoplastic material, has an increased resistance and thus improved stability with respect to UV-radiation. The increased stability with respect to the emitted radiation reduces destruction and ageing phenomena of the reflector. This extends the service life of the optoelectronic component.

The second thermoplastic material may have a higher degree of reflectivity with respect to the radiation which is emitted by the radiation-emitting device than the first thermoplastic material.

By virtue of the fact that the second thermoplastic material has a higher degree of reflectivity, this thermoplastic material can be used to form e.g. the partial region of the housing which forms the reflector. By virtue of the fact that the housing has different partial regions which for their part comprise in turn different thermoplastic materials, it is possible to adapt the corresponding partial regions directly to their requirement. As a result, it is e.g. possible to dispense, with a subsequent coating of the inner wall of the reflector, since even the first thermoplastic material has been selected such that it has the desired reflectivity. On the other hand, by reason of the subdivision into different partial regions it is therefore not necessary to manufacture the entire housing from one material which has the high reflectivity. The high reflectivity does not necessarily have to be inherent in the thermoplastic material itself, but rather can also be achieved by additives added to the thermoplastic materials. The additive can be e.g. a pigment or a metal. The pigment is preferably a white pigment. Another partial region of the housing can have other additions accordingly depending upon its requirements. Increased reflectivity can increase the light output of the optoelectronic component.

The first thermoplastic material may be selected from: high-temperature polyamide, polyetherimide, polysulfone, polyphenyl sulfide, LCPs and PEEK.

The second thermoplastic material may be selected from: polyamide, polybutylene terephthalate, polyethylene terephthalate, polyester, polyester copolymers and fluorinated polymers.

These polymers have proven to be advantageous in tests. Polybutylene terephthalate and polyamide have proven to be particularly advantageous. In this case, polyamide, polybutylene terephthalate and polyester copolymers can be crosslinked by e.g. beta-radiation.

The second thermoplastic material may be radiation-crosslinked.

Therefore, not only the first thermoplastic material, but also the second thermoplastic material has increased stability and resistance by reason of the crosslinking by irradiation. Therefore, e.g. a thermoplastic material and its degree of crosslinking can be selected such that it has a particularly high resistance to thermal influences, and the other thermoplastic material and its degree of crosslinking can be selected such that it has a particularly effective resistance to irradiation. Therefore, the housing has at least two partial regions which each comprise thermoplastic materials or are formed from thermoplastic materials, and, compared with non-crosslinked thermoplastic materials have an increased resistance tailored in each case to the requirements of the respective partial region of the housing.

The first partial region may be free of the second thermoplastic material and the second partial region may be free of the first thermoplastic material.

This means that the first partial region does not comprise the second thermoplastic material and the second partial region does not comprise the first thermoplastic material. In this case, the thermoplastic materials of the first partial region and the second partial region are tailored specifically to the requirements of the respective partial region and there is no mixture of two thermoplastic materials from which the first partial region and also the second partial region are formed.

The radiation-emitting device may be an LED.

A plurality of LEDS may be disposed in a housing. These LEDs can emit the same and also different wavelength ranges. If the housing has a plurality of recesses or one large recess which by the insertion of partition walls has several subregions which form e.g. different reflectors, each reflector can constitute a dedicated partial region which in each case has a specific thermoplastic material. This can be tailored in terms of stability and reflectivity in a specific manner to the LED which is disposed in the particular reflector or subregion. Amongst other things, the reflectivity of the different reflectors disposed in each case around the individual LEDs can be influenced by the selection of the corresponding thermoplastic material and its degree of crosslinking. Therefore, the light output of the individual LEDs and thus their proportion of mixed light which is ultimately emitted by the optoelectronic component can also be influenced by the reflectivity. The overall impression of the emitted light of the optoelectronic device can be controlled by the individual LEDs' different proportion of mixed light.

In addition to the optoelectronic component itself, there is also claimed a method for the production of an optoelectronic component, as previously described.

A method for the production of an optoelectronic component, as previously described, comprises in this case the method steps of: forming the first partial region of the housing from a material, which comprises the first thermoplastic material, as method step A), forming the second partial region of the housing from a material, which comprises the second thermoplastic material, as method step B), irradiating the first partial region so that the first thermoplastic material is crosslinked, as method step C), and introducing the radiation-emitting device into the recess of the housing, as method step D).

In this case, irradiating the first partial region, method step C), which leads to the crosslinking of the first thermoplastic material, can be performed before and also after method step B).

In the event that the second partial region also comprises a thermoplastic material crosslinked by irradiation, the first partial region and the second partial region can be irradiated in a single irradiation step. However, it is likewise also possible for each partial region in its own right to be irradiated with a specific irradiation dosage. In this case, the radiation dosage can be tailored to the respective thermoplastic material or to the desired degree of crosslinking of the thermoplastic material.

Preferably, the partial region, which has a lower thermal stability, is formed first. As a result, during formation of the thermally more stable partial region the contact surface to the partial region having the lower thermal stability can be heated for a short period of time, whereby a firm interconnection can be formed between the two partial regions.

The first partial region may be irradiated in method step C) with an irradiation dosage of 33 to 165 kGy.

In this case, the radiation dosage can be tailored to the thermoplastic material and the concentration of the crosslinking additive present in the thermoplastic material. Furthermore, the radiation dosage can also be tailored to the desired degree of crosslinking to be achieved in the thermoplastic material. The irradiating can be effected e.g. with beta radiation.

The forming in method step A) may be effected by injection-molding.

The forming in method step B) may be effected by injection-molding.

Therefore, in the case of a method for the production of the optoelectronic component, a two-component injection-molding method can be used.

Different components and methods will be described in greater detail hereinafter with reference to the Figures and examples.

FIG. 1 shows an optoelectronic component which has a housing 1 which comprises a first partial region 2 and a second partial region 3. In this example, the first partial region 2 is formed as a housing base body and the second partial region 3 is formed as a reflector. Disposed in the interior of the reflector is a radiation-emitting device 4 which is an LED. The radiation-emitting device 4 is connected in an electrically conductive manner to the first part of the lead frame 5 and via the bond wire 6 is connected in an electrically conductive manner to the second part of the lead frame 5. The recess of the housing 1, in which the radiation-emitting device 4 is disposed, is filled with a casting compound 7 which is formed on the radiation exit surface as a lens 8.

The first partial region 2 has a particularly high thermal stability, whereas the second partial region 3 has a particularly high stability with respect to radiation. Therefore, the first partial region 2 is protected by the second partial region 3 from the radiation which is output by the radiation-emitting device 4. On the other hand, the second partial region 3 can be protected by the first partial region 2 from excessive temperatures which act upon the underside of the optoelectronic component e.g. on account of soldering processes. Therefore, each of the two partial regions of the housing 1 is adapted in each case to the corresponding requirements by reason of the thermoplastic materials they comprise.

The casting compound 7 located in the recess of the housing 1 is not to be considered as a part of the housing, but rather merely as a part of the optoelectronic component as a whole.

Figure 2:
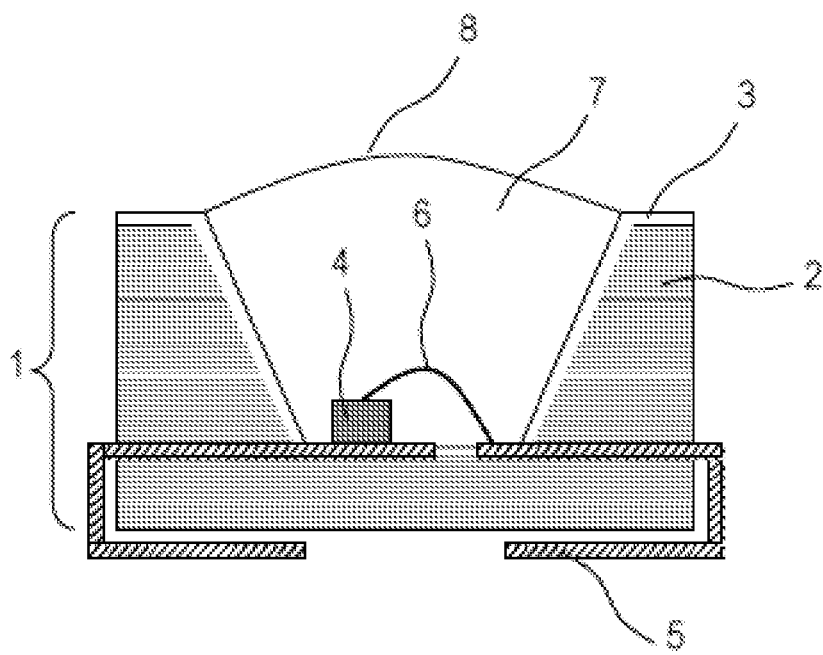
FIG. 2 shows a schematic cross section of a second example of an optoelectronic component.

FIG. 2 shows a further example which corresponds substantially to the example as illustrated in FIG. 1. The example illustrated in FIG. 2 additionally also comprises on the upper side of the housing base body a part of the second partial region 3. As a result, in the housing base body formed by the first partial region 2 is not only protected from the radiation emitted by the radiation-emitting device 4, but in addition is also protected from the radiation which acts from above upon the optoelectronic component.

My components and methods are not limited by the description using the examples. Rather, this disclosure includes any new feature and any combination of features included in particular in any combination of features in the appended Claims, even if the feature or combination itself is not explicitly stated in the claims or examples.

The invention claimed is:

1. An optoelectronic component comprising:
a housing which comprises a first partial region having a first thermoplastic material crosslinked by irradiation and a second partial region having a second thermoplastic material; wherein the first partial region is formed as a housing base body, the second partial region is formed as a reflector, the second partial region is disposed on the first partial region, the second partial region is additionally disposed on an upper side of the housing base body,
a recess in the housing; and
a radiation-emitting device that emits radiation and is disposed in the recess;
wherein the first partial region is protected by the second partial region from the radiation, and wherein the second partial region is protected by the first partial region from excessive temperatures, the second thermoplastic material has a higher degree of reflectivity with respect to the radiation emitted by the radiation-emitting device than the first thermoplastic material, the first thermoplastic material is at least selected from the group consisting of polyetherimide, polysulfone, polyphenyl sulfide, LCPs and PEEK, and the second thermoplastic material is at least selected from the group consisting of polyamide, polybutylene terephthalate, polyethylene terephthalate, polyester, polyester copolymers and fluorinated polymers.

2. The optoelectronic component as claimed in claim 1, wherein the first thermoplastic material is different from the second thermoplastic material.

3. The optoelectronic component as claimed in claim 1, wherein the first thermoplastic material has a higher thermal stability than the second thermoplastic material.

4. The optoelectronic component as claimed in claim 1, wherein after crosslinking, the first thermoplastic material has a thermal stability up to a temperature of at least 275° C.

5. The optoelectronic component as claimed in claim 1, wherein the first thermoplastic material contains a crosslinking additive.

6. The optoelectronic component as claimed in claim 5, wherein the crosslinking additive is at least one selected from the group consisting of triallyl isocyanate, trimethylolpropane triacrylate and pentaerythriol triacrylate.

7. The optoelectronic component as claimed in claim 1, wherein the second thermoplastic material is radiation-crosslinked.

8. A method of producing the optoelectronic component as claimed in claim 1, comprising:
   A) forming the first partial region of the housing from a material which comprises the first thermoplastic material, wherein the first partial region is formed as a housing base body;
   B) forming the second partial region of the housing from a material which comprises the second thermoplastic material, wherein the second partial region is formed as a reflector, the second partial region is disposed on the first partial region, and the second partial region is additionally disposed on the upper side of the housing base body;
   C) irradiating the first partial region so that the first thermoplastic material is crosslinked; and
   D) introducing the radiation-emitting device into the recess of the housing wherein radiation-emitting device can emit radiation, the first partial region is protected by the second partial region from the radiation, the second thermoplastic material has a higher degree of reflectivity with respect to the radiation, which is emitted by the radiation-emitting device, than the first thermoplastic material, the first thermoplastic material is at least selected from the group consisting of polyetherimide, polysulfone, polyphenyl sulfide, LCPs and PEEK, and the second thermoplastic material is at least selected from the group consisting of polyamide, polybutylene terephthalate, polyethylene terephthalate, polyester, polyester copolymers, and fluorinated polymers.

9. The method as claimed in claim 8, wherein the first partial region is irradiated in method step C) with an irradiation dosage of 33 to 165 kGy.

10. The method as claimed in claim 8, wherein the forming in method step A) is effected by injection-molding.

* * * * *